United States Patent
Loh et al.

(10) Patent No.: US 6,762,472 B2
(45) Date of Patent: Jul. 13, 2004

(54) SIGNAL COMMUNICATION STRUCTURES

(75) Inventors: Kah Phang Loh, Singapore (SG); Pheng Yam Ng, Singapore (SG); Sin Heng Lim, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/233,125

(22) Filed: Aug. 30, 2002

(65) Prior Publication Data

US 2004/0041246 A1 Mar. 4, 2004

(51) Int. Cl.[7] .......................................... H01L 31/0232
(52) U.S. Cl. ..................... 257/432; 257/433; 257/434; 257/777; 257/778; 257/723; 257/680
(58) Field of Search ................................ 257/432–434, 257/680, 723, 777–778

(56) References Cited

U.S. PATENT DOCUMENTS

| | | |
|---|---|---|
| 5,422,435 A | 6/1995 | Takiar et al. |
| 5,506,445 A | 4/1996 | Rosenberg |
| 5,523,608 A * | 6/1996 | Kitaoka et al. .............. 257/433 |
| 5,668,383 A | 9/1997 | Krieger |
| 5,696,031 A | 12/1997 | Wark |

FOREIGN PATENT DOCUMENTS

WO    WO 99/62121    12/1999

* cited by examiner

Primary Examiner—Thien F Tran

(57) ABSTRACT

Signal communication structures and methods for making the same are provided. One embodiment of the present invention comprises a signal communication structure. The structure comprises a signal communication element having a signal communication surface, an integrated circuit chip, and a substrate. A surface of the signal communication element other than the signal communication surface is physically coupled to a surface of the integrated circuit chip. In addition, another surface of the integrated circuit chip is communicatively coupled to the substrate. Furthermore, the size of the signal communication surface is greater than the size of the surface of the integrated circuit chip to which the signal communication element is physically coupled.

22 Claims, 3 Drawing Sheets

SIGNAL COMMUNICATION STRUCTURES

TECHNICAL FIELD

The present invention relates in general to signal communication and in particular to signal communication structures and methods for making the same.

BACKGROUND OF THE INVENTION

An infrared (IR) transceiver is a device that transmits and receives IR light signals. A typical IR transceiver includes an IR photodiode (PD) as a receiver, an IR light emitting diode (LED) as an emitter, and an integrated circuit (IC). Normally, the IC amplifies the photo-electric current of the receiver during data reception, as well as drives the emitter to emit IR signals during data transmission.

Due to the ever-decreasing size of electronic devices, there is a high demand for small transceiver packages. One existing method for reducing the package size of a transceiver consists of reducing the size of the IC and the number of pins needed for the transceiver application.

Another existing method for reducing package size is to stack the PD on the IC, which includes physically coupling the IC and PD, using "Chip-on-Chip" (COC) technology and wire-bonding both the PD and the IC to the transceiver substrate. However, in this single module, the size of the top surface (i.e., the light-collecting surface) of the PD that is coupled to the IC is limited by the size of the IC.

To demonstrate, the aforementioned wire bonding of the IC to the substrate occurs via wire-bondable pads situated on the periphery of the surface of the IC to which the PD is coupled. Therefore, these pads must be available (i.e., unobstructed) when the PD is coupled to the IC. Accordingly, the dimensions of the surface of the PD coupled to the IC can not be such that this surface covers or otherwise obstructs these wire-bondable pads. As a corollary, the dimensions of this surface can not be larger than the dimensions of the surface of the IC to which PD is coupled.

Furthermore, the dimensions of the light collecting surface of the PD correlate to those of the surface of the PD coupled to the IC. Therefore, since the surface of the PD coupled to the IC may not be larger than the surface of the IC to which the PD is coupled, neither may the light-collecting surface of the PD be larger than the surface of the IC to which the PD is coupled.

SUMMARY

The present invention is directed to signal communication structures and methods for making the same. One embodiment of the present invention allows a communication surface of a signal communication element to be larger than a surface of an integrated circuit chip to which another surface of the signal communication element is physically coupled. Since, as a result of the above, the communication surface of the signal communication element may be larger than that which was previously achievable, it follows that the maximum communication distance of the element is extended. The aforementioned signal communication surface may be a signal collecting surface or a signal emitting surface.

Furthermore, one embodiment of the present invention comprises a signal communication structure having a signal communication element, an integrated circuit chip, and a substrate. The signal communication element is physically coupled to the integrated circuit chip. In addition, the signal communication element is communicatively coupled to the substrate. Examples of the signal communication element include a signal emitter and a signal receiver.

The integrated circuit chip is communicatively coupled to the substrate in a manner allowing for the size of a communication surface of the signal communication element to be larger than that of the surface of the integrated circuit chip to which another surface of the signal communication element is physically coupled. In one embodiment, the integrated circuit chip is flip-chip bonded to the substrate. Since flip-chip bonding, unlike the earlier-discussed wire bonding, does not require bond pads to be available on the surface of the integrated circuit chip to which the signal communication element is physically coupled, the size of the communication surface of the signal communication element may be larger than that of the surface of the integrated circuit chip to which the signal communication element is coupled. Since the size of the communication surface may be larger, so to may the maximum distance at which the signal communication structure may communicate with another device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
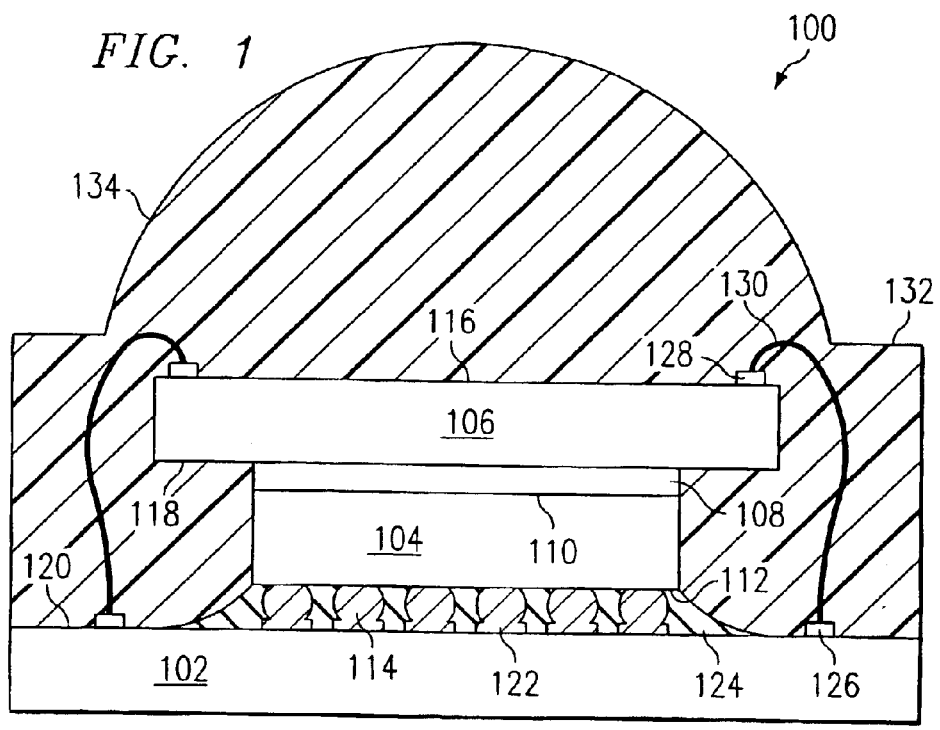
FIG. 1 depicts a cross-section of an exemplary signal communication structure in accordance with an embodiment of the present invention.

FIG. 1 depicts an exemplary signal communication structure in accordance with an embodiment of the present invention. In one embodiment, signal communication structure 100 comprises an integrated circuit chip (IC) 104 communicatively coupled to substrate 102 and a signal communication element 106 physically coupled to IC chip 104. IC chip 104 is communicatively coupled to substrate 102 in such a manner as to enable the size of signal communication surface 116 of signal communication element 106 to be greater than that of surface 110 of IC chip 104 (e.g., flip-chip bonding, ball-grid arrays, and/or the like).

In one embodiment, signal communication structure 100 comprises a discrete signal emitter. In an alternative embodiment, signal communication structure comprises a discrete signal receiver. It will be appreciated, however, that signal communication structure 100 may comprise other signal communication devices.

In the illustrated embodiment, IC chip 104 is communicatively (as well as physically) coupled to substrate 102 via flip-chip bonding. The flip-chip bond between IC chip 104 and substrate 102 may be formed by any method for flip-chip bonding, now known or later developed. As a non-limiting example, in the illustrated embodiment, IC chip 104 is flip-chip bonded to substrate 102 by reflow soldering reflow solder bumps 114 on surface 112 of IC chip 104 to flip-chip pads 122 on surface 120 of substrate 102. In some embodiments, flip-chip pads 122 are communicatively coupled to conductors (not shown) of substrate 102. In one embodiment, underfill material 124 is dispensed between surfaces 112 and 120 to, e.g., eliminate solder fatigue and/or seal any gap between surfaces 112 and 120. Solder bumps 114, as well as chip pads 122, may comprise any suitable material for flip-chip bonding, now known or later developed. Likewise, underfill material 124 may be any flip-chip bonding underfill material, now known or later developed. Other non-limiting examples of methods for flip-chip bonding IC chip 104 to substrate 102 include no-flow flip-chip bonding and pin grid arrays.

Substrate 102 may be any substrate, now known or later developed, suitable for use in signal communication structures. In the illustrated embodiment, substrate 102 is a printed circuit board (PCB). Other non-limiting examples of substrate 102 include a lead frame, a cavity base, a ceramic substrate, a flex circuit, etc. In some embodiments, substrate 102 comprises one or more conductors (not shown) for communicative coupling the substrate to one or more IC chips and/or other devices. The earlier-discussed flip-chip pads 122, as well as other bond pads, may be provided on surface 120 using any method, now know or later developed, for the provision of bond pads (e.g., screen printing, selective plating). Moreover, these bond pads may be communicatively coupled to the aforementioned conductors of embodiments of substrate 102.

IC chip 104 may comprise any IC chip operable to be communicatively coupled to the earlier-discussed substrate. Furthermore, IC chip 104 may comprise any circuit element, now known or later developed, operable to process communication signals, store communication signals, control operations of a component(s) of signal communication structure 100, and/or the like. Moreover, IC chip 104 may comprise a plurality of such elements. In one embodiment, circuitry (not shown) within IC chip 104 is operable to process (e.g., amplify) signals generated by signal communication element 106 in response to communication signals received thereby. In addition or in the alternative, such circuitry may be operable to drive signal communication element 106. In some embodiments, circuitry within IC chip 104 communicates with external circuitry (not shown) and/or other components of signal communication structure 100 through the earlier-discussed communicative coupling of IC chip 104 to substrate 102.

Signal communication element 106 may be any device (or group of devices), now known or later developed, that is operable to receive signals (i.e., a signal receiver). For example, signal communication element 106 may comprise one or more photodiodes (e.g., PIN diodes). In one embodiment, signal communication element 106 comprises an infrared signal receiver. In some embodiments where signal communication element 106 comprises a signal receiver, surface 116 thereof comprises a signal collecting surface (e.g., a light collecting surface).

Furthermore, signal communication element 106 may comprise any device (or group of devices), now known or later developed, that is operable to emit signals (i.e., a signal emitter). For example, signal communication element 106 may comprise an infrared signal emitter (e.g., an infrared LED). In one embodiment, signal emitter 106 comprises a surface emitting laser (VCSEL). In some embodiments where signal communication element 106 comprises a signal emitter, surface 116 thereof comprises a signal emitting surface (e.g., a light emitting surface).

As mentioned, signal communication element 106 may be physically coupled to IC chip 104. In the illustrated embodiment, surface 118 of signal communication element 106 is coupled to surface 110 of IC chip 104. Signal communication element 106 may be physically coupled to IC chip 104 by any means, now know or later developed, for coupling an object to an IC chip. Non-limiting examples of such means include adhesive 108. Adhesive 108 may be any suitable adhesive for bonding an object to an integrated circuit chip, non-limiting examples of which include adhesive films or liquid adhesives, such as epoxy, novalac, and silicon.

Signal communication element 106 may also be communicatively coupled to substrate 102. In the illustrated embodiment, signal communication element 106 is wire-bonded to substrate 102 via at least one wire 130. Such wire-bonding may be by any means, now known or later developed, for wire-bonding a signal communication element to a substrate. Non-limiting examples of such bonding include wiring bond pads (e.g., bond pad 128) on signal communication surface 116 of signal communication element 106 to wire bond pads (e.g., bond pad 126) on surface 120 of substrate 102. The bond pads may be any bond pads, now known or later developed, for wire-bonding. Furthermore, such pads may be formed by any means, now known or later developed, for the formation of such wire bond pads. As discussed earlier, these wire bond pads may be communicatively coupled to the aforementioned conductors of embodiments of substrate 102. In one embodiment, IC chip 104 and signal communication element 106 communicate, in part, through such conductors.

The wire bond pads on surface 120 may at least partially bound the area comprising flip-chip pads 122. Furthermore, flip-chip pads 122 and the aforementioned wire bond pads may be connected to different conductors of substrate 102 such that signal communication element 106 and IC chip 104 may receive different signals.

In the illustrated embodiment, the size of signal communication surface 116 is greater than that of surface 110 of IC chip 104. The communicative coupling between IC chip 104 and substrate 102 helps make such size differential possible. To demonstrate, in the illustrated embodiment, IC chip 104 is flip-chip bonded to substrate 102. Because flip-chip bonding, unlike wire-bonding, does not require bond pads to be available on the surface 110 of IC chip 104, the size of surface 118 of signal communication element 106 may be larger than that of surface 110. Moreover, because the size of surface 118 may be greater than that of surface 110, so to may signal communication surface 116.

Signal communication structure 100 may further comprise a body 132 encapsulating IC chip 104 and signal communication element 106. Body 132 may comprise any encapsulating material, now known or later developed, suitable for use in signal communication devices (e.g., a molding compound, a plastic, and/or the like). In the illustrated embodiment, body 132 comprises an integral lens 134 aligned with signal communication element 106.

It will be appreciated that the items depicted in FIG. 1, as well as the arrangement of these items, is by way of example only. Signal communication structure 100 may have more, fewer, and/or different components than those depicted in FIG. 1. Moreover, the components may be arranged differently than that depicted in FIG. 1.

Figure 2:
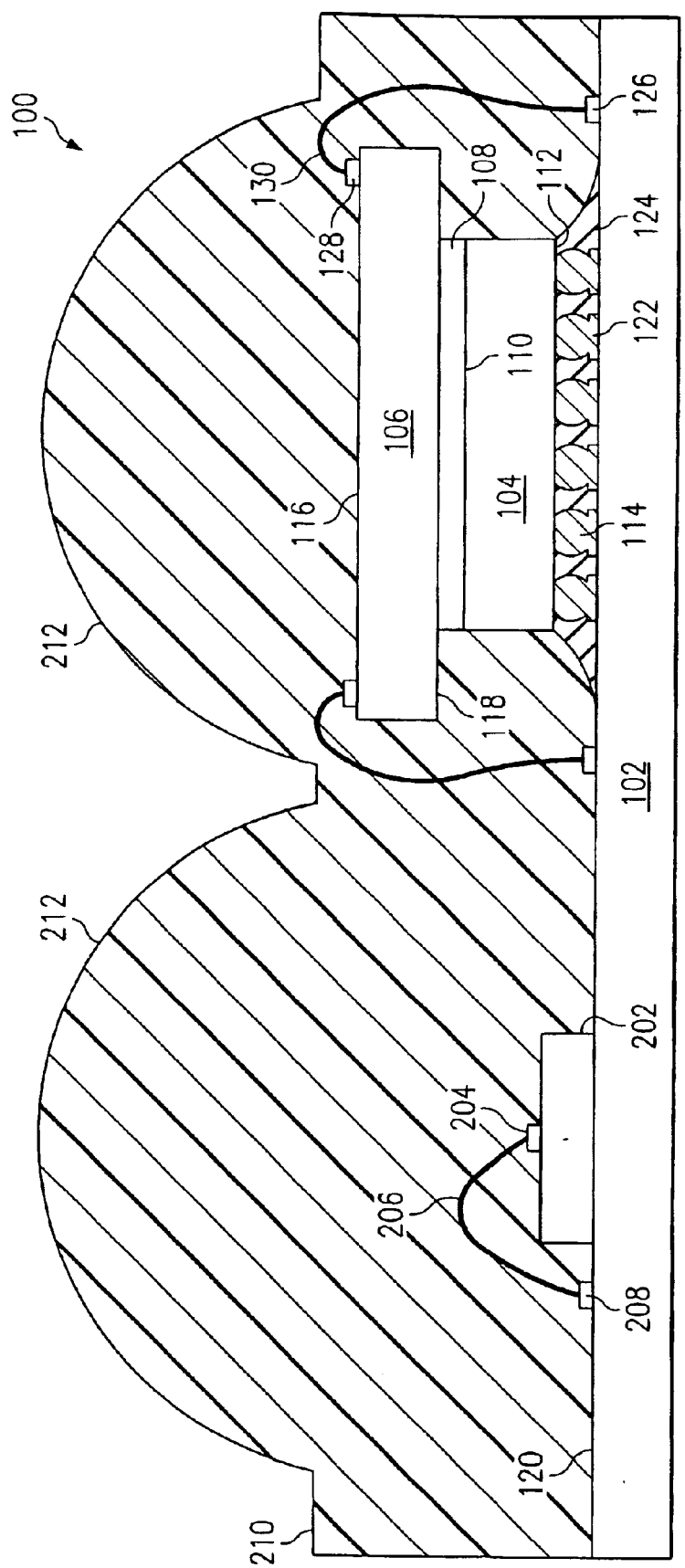
FIG. 2 depicts a cross-section of yet another exemplary signal communication structure in accordance with an embodiment of the present invention.

For example, FIG. 2 provides a cross-section of another exemplary embodiment of signal communication structure 100. Like the embodiment depicted in FIG. 1, in FIG. 2, signal communication structure 100 comprises integrated circuit chip (IC) 104 communicatively coupled to substrate 102 and signal communication element 106 physically coupled to IC chip 104. Moreover, IC chip 104 is communicatively coupled to substrate 102 in such a manner as to enable the size of signal communication surface 116 of signal communication element to be greater than the size of surface 110 of IC chip 104. Moreover, the earlier-discussions regarding FIG. 1 apply equally to those elements of FIG. 1 that also appear in FIG. 2.

However, unlike the embodiment illustrated in FIG. 1, the embodiment of signal communication structure 100 depicted in FIG. 2 comprises another signal communication element 202. For example, signal communication structure 100 may comprise a transceiver.

Signal communication element 202 may be a signal receiver or a signal emitter (e.g., an infrared signal receiver or an infrared signal emitter). In one embodiment, signal communication element 202 comprises an infrared LED or a VCSEL. However, in an alternative embodiment, signal communication element 202 comprises one or more photodiodes (such as PIN diodes).

Signal communication element 202 may be communicatively coupled to substrate 102. Such communicative coupling may be via any means, now known or later developed, for communicatively coupling a signal communication element to a substrate. In one embodiment, signal communication element 202 is wire-bonded to substrate 102 by coupling bond pad(s) 204 of signal communication element 202 to bond pad(s) 208 on surface 120 of substrate 102 via one or more wires 206. Bond pad(s) 208 may be communicatively coupled to the aforementioned conductors of embodiments of substrate 102. Furthermore, the conductors to which bond pad(s) 208 are communicatively coupled may be different from those to which flip-chip pads 122 and/or wire bond pads 126 are communicatively coupled.

Furthermore, IC chip 104 may comprise circuitry for processing signals generated by signal communication element 202 and/or for driving signal communication element 202. In one embodiment, IC chip 104 and signal communication element 202 communicate, in part, through the earlier-discussed conductors of substrate 102.

In the illustrated embodiment, signal communication structure 100 further comprises a body 210 encapsulating IC chip 104, signal communication element 106, and signal communication element 202. Body 210 may comprise any encapsulating material, now known or later developed, suitable for use in signal communication devices (e.g., a molding compound, a plastic, and/or the like).

In one embodiment, body 210 comprises an integral lens 212 aligned with signal communication element 106. Lens 212 may also be aligned with signal communication element 202. Lens 212 may comprises a single integral lens or a plurality of integral lenses.

Similar to the above, it will be appreciated that the items depicted in FIG. 2, as well as the arrangement of these items, is by way of example only. Signal communication structure 100 may have more, fewer, and/or different components than those depicted in FIG. 2. Moreover, the components may be arranged differently than that depicted in FIG. 2.

Figure 3:
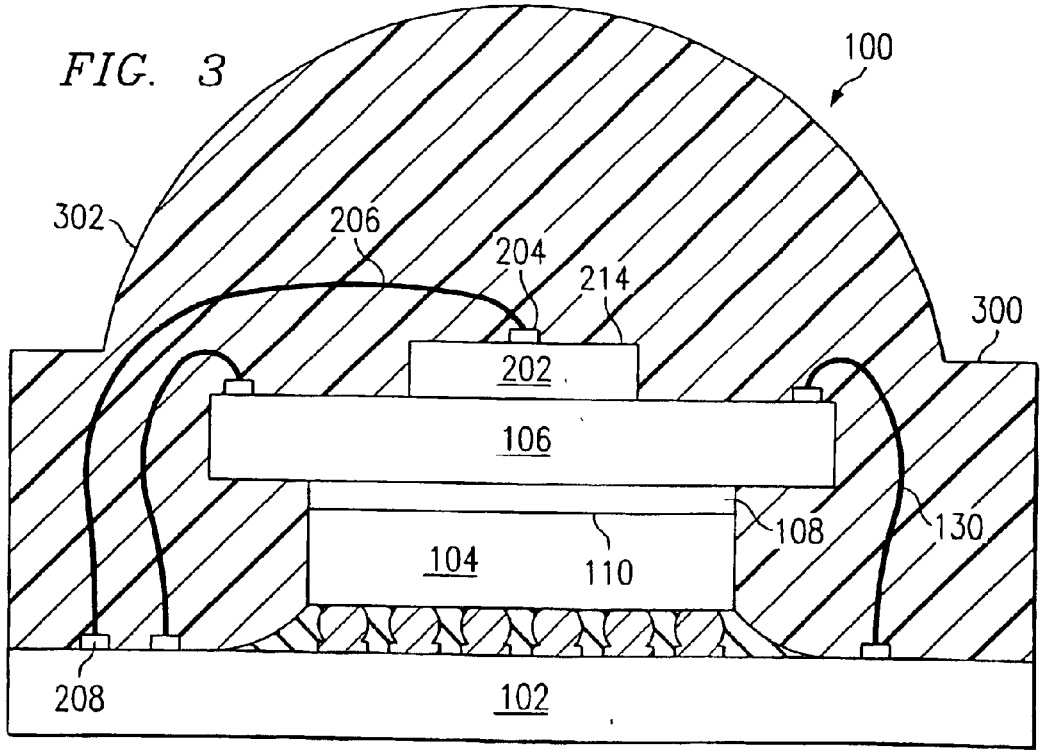
FIG. 3 depicts a cross-section of still another exemplary signal communication structure in accordance with an embodiment of the present invention.

As yet another example, FIG. 3 depicts another alternative embodiment of signal communication structure 100. In FIG. 3, like FIG. 2, signal communication structure 100 comprises integrated circuit chip (IC) 104 communicatively coupled to substrate 102 and signal communication element 106 physically coupled to IC chip 104. Moreover, IC chip 104 is communicatively coupled to substrate 102 in such a manner as to enable the size of signal communication surface 116 of signal communication element to be greater than the size of surface 110 of IC chip 104.

However, unlike the embodiment illustrated in FIG. 2, signal communication element 202 is stacked on signal communication element 106 and communicatively coupled to substrate 102. As a result, the density of components on substrate 132 is increased. Of course, although signal communication element 202 is shown in FIG. 3 stacked on top of signal communication element 106, the present invention includes within its scope multiple components stacked on top of signal communication element 106

Furthermore, in the illustrated embodiment, signal communication surface 214 of signal communication element 202 is smaller in size than that of surface 110 of IC chip 104. However, it will be appreciated that signal communication surface 210 may have a size greater than that of surface 210.

Similar to the above, signal communication element 202 may be communicatively coupled to substrate 102 via any means, now known or later developed, for communicatively coupling a signal communication element to a substrate. In one embodiment, signal communication element 202 is wire-bonded to substrate 102 by coupling bond pad(s) 204 of signal communication element 202 to bond pad(s) 208 on surface 120 of substrate 102 via one or more wires 206. Bond pad(s) 208 may be communicatively coupled to the aforementioned conductors of embodiments of substrate 102. Furthermore, the conductors to which bond pad(s) 208 are communicatively coupled may be different from those to which flip-chip pads 122 and/or wire bond pads 126 are communicatively coupled.

Also similar to the above, IC chip 104 may comprise circuitry for processing signals generated by signal communication element 202 and/or for driving signal communication element 202. In one embodiment, IC chip 104 and signal communication element 106 communicate, in part, through the earlier-discussed conductors of substrate 102.

In the illustrated embodiment, a body 300 encapsulates IC chip 104, signal communication element 106, and signal communication element 202. Similar to bodies 132 and 210, body 300 may comprise any material, now known or later developed, suitable for use in encapsulating signal communication devices (e.g., a molding a compound, a plastic, and/or the like). Furthermore, in one embodiment, body 300 comprises an integral lens 302 aligned with both signal communication element 106 and signal communication element 202.

Figure 4:
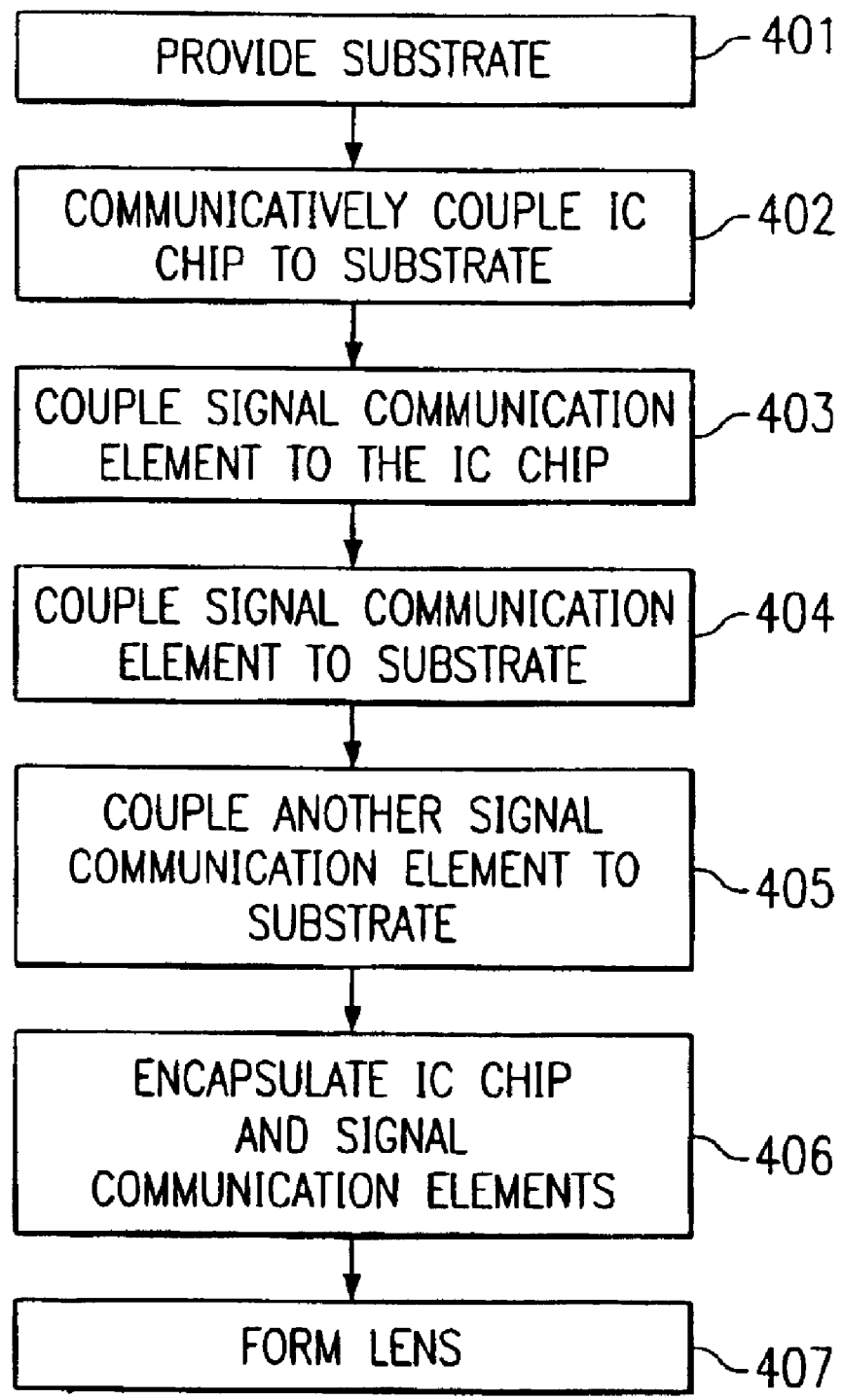
FIG. 4 depicts exemplary steps of a method for forming a signal communication structure in accordance with an embodiment of the present invention.

FIG. 4 depicts exemplary steps of a method 400 for assembling signal communication structure 100 in accordance with an embodiment of the present invention. In the illustrated embodiment, substrate 102 is provided (step 401). In some embodiments, flip-chip bondable pads 122 and/or wire bond pads (e.g., pads 126 and 208) are provided on surface 120 of substrate 102 (e.g., via screen printing or selective plating). Moreover, substrate 102 may comprises one or more conductors.

In the illustrated embodiment, after substrate 102 is provided, IC chip 104 is communicatively coupled to substrate 102 in a manner that enables the size of signal communication surface 116 of signal communication element 106 to be greater than the size of surface 110 of IC chip 104 (e.g., flip-chip bonding, ball-grid array, and/or the like) (step 402). In one embodiment, as part of such, IC chip 104 is flip-chip bonded to substrate 102. Such flip-chip bonding may comprise aligning reflow solder bumps 114 with flip-chip pads 122, reflow soldering bumps 114 to pads 122, and dispensing underfill material 124 between surfaces 112 and 120. As mentioned pads 122 may be communicatively coupled to one or more conductors of substrate 102.

Before, simultaneously with, and/or after the above, signal communication element 106 is physically coupled to IC chip 104 via, e.g., adhesive 108 (step 403). In some embodiments, adhesive 108 is cured after signal communication element 106 is stacked on IC chip 104. In one embodiment, the size of surface 116 of signal communication element 106 is greater than the size of surface 110 of IC chip 104 (the surface of IC chip 104 to which signal communication element 106 is coupled). Signal communication element 106 may then be communicatively coupled to substrate 102, e.g., via wire-bonding to bond pads of substrate 102 (step 404). These bond pads may be communicatively coupled to one or more conductors of substrate 102.

In some embodiments, signal communication element 202 is also communicatively coupled to substrate 102 (step 405). In one embodiment, this additional signal communication element is wire-bonded to wire-bond pads (e.g., bond pad(s) 208) of substrate 102. These wire-bond pads may also be communicatively coupled to one or more conductors of substrate 102.

IC chip 104, signal communication element 106, and signal communication element 202 may be encapsulated in a body (e.g., body 210) (step 406). As part of such encapsulating, an integral lens aligned with signal communication element 106 is formed (step 407). This integral lens may also be aligned with signal communication element 202.

It will be appreciated that steps depicted in FIG. 4 are by way of example only. Method 400 may comprise more, fewer, and/or different steps than those depicted in FIG. 4, as well as performed in a different order than that depicted in FIG. 4. For example, signal communication element 202 may be communicatively coupled to substrate 102 prior to the physical coupling of signal communication element 104 to substrate 102.

In various embodiments, the present invention alleviates some of the difficulties associated with the prior art. For example, in one embodiment, the size of signal communication surface 116 of signal communication element 106 may be greater than that of surface 110 of IC chip 104. As a result, the maximum possible distance at which signal communication structure 100 can communicate with another device may be extended.

Moreover, in some embodiments, flip-chip bonding between IC chip 104 and substrate 102 allows for a higher number of interconnects than that which is involved in wire-bonding. Similarly, in one embodiment, short flip-chip interconnects between IC chip 104 and substrate 102 reduces inductance noise and thus allows for better electrical performance. Furthermore, in some embodiments, as a result of flip-chip bonding between IC chip 104 and substrate 102, heat can be directly conducted via the solder bumps to the bond pads on the substrate, and, therefore, better thermal performance is achieved. In addition, in some embodiments, due to flip-chip bonding of IC chip 104, no wire sweep occurs during injection molding as there is no wire bonding on IC chip 104. Moreover, in one embodiment, as a result of flip-chip bonding, no wirebond fracture or liftoff is experienced on IC chip 104 during thermal cycling. As a result, better reliability is achieved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A signal communication structure comprising:
    a signal communication element;
    an integrated circuit chip; and
    a substrate;
    wherein the integrated circuit chip is disposed between the signal communication element and the substrate:
    wherein a surface of said signal communication element is physically coupled to a surface of said integrated circuit chip;
    wherein another surface of said integrated circuit chip is communicatively coupled to said substrate; and
    wherein a size of a signal communication surface of said signal communication element is greater than the-a size of said surface of said integrated circuit chip to which said signal communication element is physically coupled.

2. The structure of claim 1 wherein said signal communication element is communicatively coupled to said substrate.

3. The structure of claim 2 wherein said signal communication element is communicatively coupled to said substrate via wire bonding.

4. The structure of claim 1 wherein said structure further comprises a body encapsulating at least said signal communication element and said integrated circuit chip.

5. The structure of claim 4 wherein said body comprises an integral lens aligned with said signal communication element.

6. The structure of claim 2 wherein said signal communication element comprises a signal receiver; and
wherein said signal communication surface comprises a signal collecting surface.

7. The structure of claim 6 wherein said signal communication element comprises an infrared receiver; and wherein said signal communication surface comprises an infrared light collecting surface.

8. The structure of claim 6 wherein said integrated circuit chip comprises circuitry for processing signals produced by said signal receiver.

9. A signal communication structure comprising:
a signal communication element:
an integrated circuit chip: and
a substrate that comprises a printed circuit board,
wherein a surface of said signal communication element is physically coupled to a surface of said integrated circuit chip, another surface of said integrated circuit chip is communicatively coup led to said substrate, and a size of a signal communication surface of said signal communication element is greater than a size of said surface of said integrated circuit chip to which said signal communication element is physically coupled.

10. A signal communication structure comprising:
a signal communication element;
an integrated circuit chip; and
a substrate;
wherein a surface of said signal communication element is physically coupled to a surface of said integrated circuit chip, another surface of said integrated circuit chip is flip-chip bonded to said substrate, and a size of a signal communication surface of said signal communication element is greater than a size of said surface of said integrated circuit chip to which said signal communication element is physically coupled.

11. A signal communication structure comprising:
a signal communication element comprising a signal receiver;
an integrated circuit chip;
a substrate; and
a signal emitter communicatively coupled to said substrate;
wherein a surface of said signal communication element is physically coupled to a surface of said integrated circuit chip, another surface of said integrated circuit chip is communicatively coupled to said substrate, a size of a signal communication surface of said signal communication element is greater than a size of said surface of said integrated circuit chin to which said signal communication element is physically coupled, and said signal communication surface comprises a signal collecting surface.

12. The structure of claim 11, wherein said integrated circuit chip comprises circuitry for driving said signal emitter.

13. The structure of claim 11 wherein said signal emitter is stacked on said signal receiver.

14. A signal communication structure comprising:
a signal communication element comprising a signal emitter;
an integrated circuit chip; and
a substrate
wherein a surface of said signal communication element is physically coupled to a surface of said integrated circuit chip, another surface of said integrated circuit chin is communicatively coupled to said substrate, a size of a signal communication surface of said signal communication element is neater than a size of said surface of said integrated circuit chip to which said signal communication element is physically coupled, and said signal communication surface comprises a signal emitting surface.

15. The structure of claim 14 wherein said signal emitter comprises an infrared signal emitter; and wherein said signal emitting surface comprises an infrared signal emitting surface.

16. A signal communication structure comprising:
a signal communication element:
an integrated circuit chip:
a substrate; and
a body encapsulating at least said signal communication element and said integrated circuit chip, said body comprising an integral lens aligned with said signal communication element;
wherein the integrated circuit chip is disposed between the signal communication element and the substrate, a surface of said signal communication element is physically coupled to a surface of said integrated circuit chip, another surface of said integrated circuit chip is communicatively coupled to said substrate, a size of a signal communication surface of said signal communication element is greater than a size of said surface of said integrated circuit chip to which said signal communication element is physically coupled, said body further encapsulates another signal communication element of said structure, and said integral lens is also aligned with said another communication element.

17. A signal communication structure comprising:
a substrate;
a signal communication element;
an integrated circuit chip;
means for physically coupling a surface of said signal communication element to a surface of said integrated circuit chip; and
means for communicatively coupling another surface of said integrated circuit chip to said substrate;
wherein the integrated circuit chip is disposed between the signal communication element and the substrate; and
wherein said communicative coupling means enables a size of a signal communication surface of said signal communication element to be greater than a size of said surface of said integrated circuit chip.

18. The structure of claim 17 wherein said structure further comprises means for communicatively coupling said signal communication element to said substrate.

19. The structure of claim 17 wherein said signal communication element comprises a signal receiver; and wherein said signal communication surface comprises a signal collecting surface.

20. The structure of claim 19 wherein said integrated circuit chip comprises circuitry for processing signals produced by said signal receiver.

21. A signal communication structure comprising:
a substrate;
a signal communication element that comprises a signal receiver;
an integrated circuit chip;

means for physically coupling a surface of said signal communication element to a surface of said integrated circuit chip;

means for communicatively coupling another surface of said integrated circuit chip to said substrate; and a signal emitter;

wherein said communicative coupling means enables a size of a signal communication surface of said signal communication element to be greater than a size of said surface of said integrated circuit chip, and said signal communication surface comprises a signal collecting surface.

22. The structure of claim 21 wherein said structure further comprises a body encapsulating said integrated circuit chip, signal receiver, and signal emitter; and wherein said body comprises an integral lens aligned with said signal receiver and said signal emitter.

* * * * *